United States Patent [19]

Nulty

[11] Patent Number: 5,441,596

[45] Date of Patent: Aug. 15, 1995

[54] METHOD FOR FORMING A STABLE PLASMA

[75] Inventor: James E. Nulty, San Jose, Calif.

[73] Assignee: Cypress Semiconductor Corporation, San Jose, Calif.

[21] Appl. No.: 281,438

[22] Filed: Jul. 27, 1994

[51] Int. Cl.⁶ .............................................. H05H 1/00
[52] U.S. Cl. ................................................. 156/643.1
[58] Field of Search ................................. 156/643, 646; 204/298.08, 298.34, 192.32; 118/723 E, 723 ER

[56] References Cited

U.S. PATENT DOCUMENTS

| | | | |
|---|---|---|---|
| 4,679,007 | 7/1987 | Reese et al. | 333/17.3 |
| 4,808,258 | 2/1989 | Otsubo et al. | 156/643 |
| 5,223,457 | 6/1993 | Mintz et al. | 156/643 X |
| 5,288,971 | 2/1994 | Knipp | 204/298.08 |

Primary Examiner—Thi Dang
Attorney, Agent, or Firm—Blakely, Sokoloff, Taylor & Zafman

[57] ABSTRACT

A method for forming a stable plasma, particularly in the high power and low pressure ranges. The method may be used in a plasma system such as that used for a plasma etch. First, the radio frequency power is turned on under low power and high pressure. The plasma is allowed to stabilize without tuning. Next, the pressure is dropped to the desired operating level and the tuning system is engaged. After tuning at the low power and low pressure, the radio frequency power is ramped to the desired level. Finally, the system is again tuned at the higher power.

36 Claims, 3 Drawing Sheets

METHOD FOR FORMING A STABLE PLASMA

BACKGROUND OF THE INVENTION

1. Field of the Invention

The present invention relates to the field of semiconductor fabrication, and more specifically to a method for repeatable plasma ignition and RF tuning in plasma systems.

2. Background Information

In the fabrication of semiconductor devices, processing in a plasma is commonly used in many process steps, such as sputter deposition, sputter etching, and other plasma or plasma assisted processes such as plasma enhanced chemical vapor deposition, reactive ion etching (RIE), and other plasma processes.

Typically, the plasma is generated by coupling radio frequency (RF) electro-magnetic energy to the plasma. The RF energy is supplied by an RF generator coupled to a power supply. Because the plasma has a variable impedance, a matching network is employed to match the impedance of the power supply with that of the plasma. The matching network may include one or more capacitors and one or more inductors to achieve the match and thereby tune the RF power. Typically, the tuning may be done automatically by an automatic matching network (AMN). When tuned, most of the power output of the RF generator is coupled to the plasma. The power to the plasma is often referred to as forward power. When the system is improperly tuned, some of the power is not coupled to the plasma, but is lost, for example, as reflected power. When power is lost in this manner, the plasma is unstable, such that the characteristics of the plasma vary depending upon the degree of tuning. An unstable plasma is problematic in that it is difficult to achieve consistent results from the plasma process, since the characteristics of the plasma vary during the process. For example, if an etch recipe designed to remove a given amount of material is performed without proper tuning, such that the reflected power is high during a significant portion of the etch, a reduced amount of etching will occur compared with an etch performed with proper tuning for most of the etch. Additionally, other characteristics of the etch, such as uniformity, etc. may be adversely affected by an unstable plasma.

During tuning, the matching network attempts to achieve a match through an iterative process during which a variable capacitance and/or a variable inductance is changed. Often, a match cannot be achieved, and the reflected power may not be reduced to an acceptable level by the matching network. At the beginning of the plasma process, the matching network has a small range of, for example, capacitance values over which a plasma will be ignited. If the reflected power does not reach an acceptable level in this range, the plasma process cannot start. Even if a plasma has been struck, the reflected power may reach unacceptable levels during the process, resulting in the unstable plasma condition described above. For example, FIG. 1 illustrates an example of reflected power as a function of time, as shown by curve 101, for a condition where there is difficulty in achieving a match. As can be seen, oscillations in the reflected power occur during tuning. These oscillations may result in the average reflected power increasing, rather than decreasing during tuning. It is particularly difficult to tune the power at the beginning of the plasma process, because voltage transients occur which may be larger than the voltage rating of the blocking capacitor used in the RF tuning circuit. When the rating is exceeded, an arc occurs inside the capacitor, creating an unstable plasma condition. Once the arc has occurred, the power must be turned off and the process repeated. When the power is turned on again, the same cycle may again occur.

It is typically difficult to ignite and stabilize a plasma under high DC bias voltage conditions, which typically occur under low pressure conditions and/or under high power conditions. It is desirable to form a plasma under these conditions, as better performance, for example, of an etch with regard to characteristics such as selectivity, process window, aspect ratio dependency, minimum feature size, reduction of undercutting, and other characteristics, is achieved under these conditions. While some plasma system manufactures are striving to produce systems which may operate in the low pressure and/or high power regime, such systems are not widely available for production use, and are very costly. In addition, there exists a large installed base of systems for which desired conditions are outside of the normal operating range. Alternatively, attempts can be made to strike and tune a plasma under these desired conditions. However, poor repeatability results for the reasons described above. As a further alternative, it may be possible to strike and tune the plasma under high power/high pressure conditions, with a gas additive such as $C_2F_6$, tune at these conditions, and then drop the pressure to a desired level while continuing to tune. However, this method also leads to poor repeatability under high voltage conditions. Additionally, while certain gases lead to more stable plasmas, it may not be desirable to have these gases from a process standpoint.

What is needed is a method for repeatable plasma ignition and RF tuning. The method should allow for plasma processing under high DC bias voltage conditions, such as in the low pressure and/or high power regime. The method and apparatus should be capable of extending the operating range into the high bias voltage regime of existing systems. Further, the method and apparatus should be capable of extending the operating ranges of advanced systems as well.

SUMMARY OF THE INVENTION

A method for forming a stable plasma is disclosed. The method may be used for, for example, forming a plasma to perform an etch process. The process gas is introduced into the chamber at a first, high pressure level. A radio frequency power is then applied at a first, low power level between two electrodes to form a plasma at the first power and first pressure. The plasma is allowed to stabilize without engaging the tuning network. In this way, a stable plasma may be struck without the earlier described problems since the power is in a range where transients are relatively low and striking and stabilizing a plasma is relatively easy. In one embodiment, the pressure is then reduced to a second, low level and the tuning system is engaged. After tuning at the first power level and second pressure level, the tuning system is disengaged. The power is then increased to a second, higher level with the tuning network disengaged. Finally, after the power ramp, the matching network is engaged to tune the RF power. Since the tuning at high power occurs after startup, startup transients are no longer present so that the tuning at the high power is performed more easily than in the case where it is attempted at startup.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method for forming a stable plasma is disclosed. In the following description, numerous specific details are set forth such as specific materials, parameters, equipment, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

As described earlier, it is difficult to ignite and tune a plasma repeatedly under high DC bias voltage conditions. These conditions typically occur under low pressure, for example, approximately 100 millitorr (mTorr) or less, and/or under high power, for example, approximately 400 Watts or greater. The difficulty in igniting and tuning a plasma may vary from system to system, but in any given system, the most difficulty will be encountered at the lower end of the pressure operating range, and the higher end of the power operating range, and will be particularly difficult when the process is operated at both the low pressure and the high power ends of the operating ranges. The present invention provides stable plasma ignition and tuning under high DC bias voltage operating conditions, which allows for operation typically beyond the pressure range of a given system. For example, in one embodiment the present invention is practiced on a Drytek Triode 384T system. In one embodiment, the invention is used to perform a contact etch process though an oxide layer. It will be appreciated however that the invention can be used in other plasma systems such as those described in the Background section, and may be used to perform other processes, including etch and deposition processes.

Figure 1:
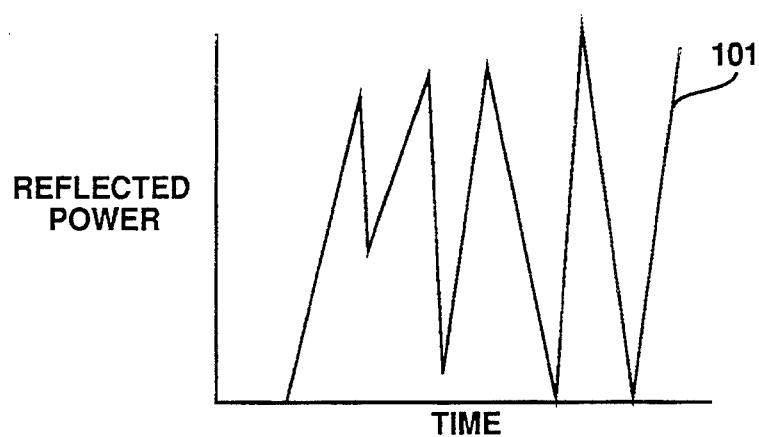
FIG. 1 illustrates reflected power in a plasma system as a function of time in a prior art process.
Figure 2:
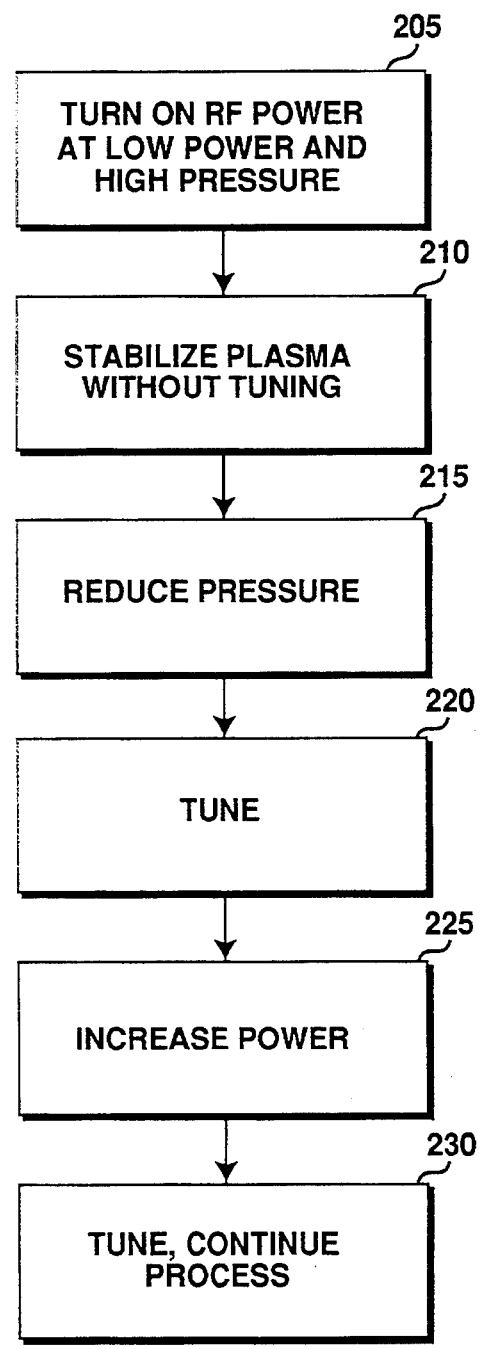
FIG. 2 shows a flow diagram of a method of forming a plasma according to an embodiment of the present invention.

Referring to FIG. 2, a flow chart of an embodiment of the present invention as practiced on the above described etcher in the above described process is shown. To achieve the desired etching results, it is desired to carry out the etch at a pressure of approximately 100 mTorr or less, and a power of approximately 400 Watts or more, to achieve better performance in etch characteristics such as selectivity, minimum feature size, minimal undercutting, selectivity, improved process latitude, and other characteristics. However, striking and tuning a plasma in this range is typically very difficult, and, even if the plasma is struck inconsistent results can normally be expected due to the earlier described problems in effectively tuning the RF power. Therefore, in step 205 the RF power is turned on at a relatively low power level and a relatively high pressure level. For example, in one embodiment the RF power in step 205 is 300 Watts and the pressure is 150 mTorr. In one embodiment, the etchant gas mixture comprises a flow of 40 standard cubic centimeters per minute (SCCM) $CHF_3$ (Freon 23), 10 SCCM $C_2F_6$ (Freon 116), and 3 SCCM of $C_2H_2F_4$ (Freon 134a). Under these conditions, the plasma may easily be started with low voltage transients. Next, in step 210 the plasma is allowed to stabilize, i.e., the plasma is run until a consistent plasma condition is achieved, without tuning. Because the process parameters described above in conjunction with step 205 result in low DC bias voltage conditions, the plasma is quickly stabilized. For example, this step may last approximately 1–4 seconds.

After achieving a consistent plasma condition, the pressure is reduced as shown in step 215. In a currently preferred embodiment, the pressure is reduced to below 100 mTorr, for example to approximately 50 mTorr. In this step the power remains at 300 Watts. Additionally, the flow of etchant gases remains approximately the same as that described above in step 205. Next, in step 220 the RF power is tuned by engaging the system's automatic matching network. Because the plasma has been ignited in step 205, and stabilized in step 210, prior to the reduction of pressure in step 215, the difficulties typically encountered when igniting a plasma under low pressure conditions are avoided in step 220. In this way, the RF power can be quickly tuned without the oscillations encountered in the prior art. The steps 215 and 220 are carried out for a total time of approximately 5–10 seconds in a currently preferred embodiment. Although this tuning occurs under slightly different conditions from the desired final operating conditions, the tune point at this time will be relatively close to the final tune point because tuning is largely pressure driven, and the pressure at this point is close to the final desired operating pressure. Therefore, when the system is again tuned at the final operating conditions, as described below, only a minor adjustment is necessary.

Still referring to FIG. 2, in step 225 the power is increased. In a preferred embodiment the power is increased above 400 Watts, for example, to a value of approximately 600 Watts. At this time, if desired, the pressure may be further reduced. In one embodiment, the pressure is reduced in step 225 to 30 mTorr. Also in a currently preferred, in this step the flow of Freon 116 is shut off so that the remainder of the process is carried out in a flow comprising 40 SCCM Freon 23 and 3 SCCM Freon 134a. Then, as shown in step 230, the RF power is tuned by engaging the automatic matching network. Typically, the tuning occurs relatively quickly, as will be described in relation to FIG. 3, so that the process may be carried out at the conditions described in relation to step 225, with a low reflected power, for the remainder of the process. Typically, the process is continued for a sufficient time to complete the etch process. For example, in a currently preferred embodiment where approximately 12,000 angstroms of oxide are to be etched, this etch is performed for approximately 5 minutes. Additionally, starting at step 225, a backside helium pressure of 8 Torr with a flow of 3 SCCM is utilized to cool the wafer during etching.

It will be appreciated that although the present invention is illustrated as several discrete steps as shown in FIG. 2, several of the steps shown therein may in essence be combined in a single step by virtue of the programming or operation of the etcher. For example, in the present invention, as described above, the RF power is turned on and the plasma is stabilized, as shown by steps 205 and 210 under low power and high pressure. This may be accomplished by programming the system with an appropriate recipe having the power and pressure as described for step 205 above, and by programming the system to ignite the plasma and maintain the programmed power and pressure levels for a pre-determined period of time without engaging the automatic tuning network. Because the system does not tune in this step, the earlier described problem of waiting for a proper impedance match before striking the plasma is avoided. Since the conditions are such that the plasma may be struck and stabilized repeatably, the step can be carried out quickly, without worry of a failure of the plasma to ignite and without worry of an unstable plasma. Next, the system can be programmed to reduce the pressure and engage the automatic tuning network as described in conjunction with steps 215 and 220. Again, since the system has already started up, the tuning proceeds quickly and without transients which exceed the match network power or voltage ratings. As described above this step takes place in a relatively short period of time. Similarly, when the system is next programmed to then increase the power and tune as described in steps 225 and 230, tuning takes place quickly because the system has started in the regime where starting and stabilizing a plasma are relatively easy, and the voltage across the capacitors at the time of steps 225 and 230 is primarily that due to the plasma and not transients. Since the tuning occurs early in this step, a great majority of the etch occurs at the desired high power, low pressure conditions and at a consistent, low value of reflected power. Therefore, the great majority of the etch is carried out under consistent conditions. For example, at the 30 mTorr and the 600 Watts described above. As described earlier, in the prior art, achieving a consistent etch under these conditions was difficult, mainly due to problems igniting and stabilizing the plasma under such conditions. By avoiding these conditions during start up, the present invention avoids the prior art processing inconsistency.

Figure 3:
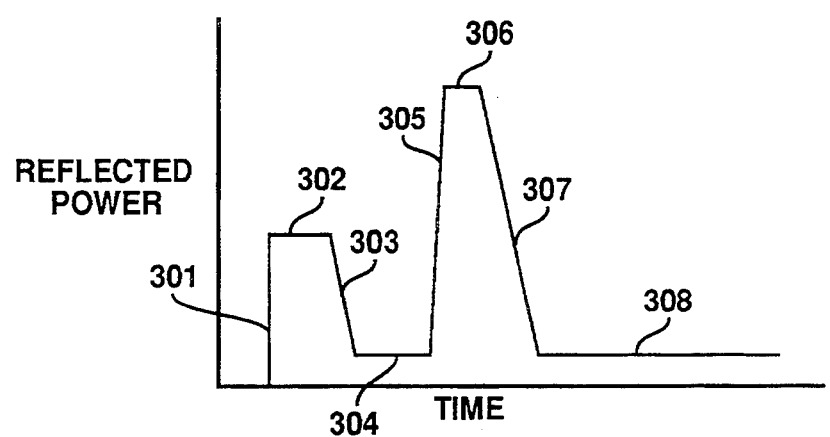
FIG. 3 illustrates reflected power as a function of time in the method of FIG. 2.

Referring to FIG. 3, a graph illustrating reflected power versus time is shown. It will be appreciated that the graph in FIG. 3 is merely exemplary and the relative value of reflected power versus time may be different at different points in the process depending upon the exact parameters, process gases, etc. used. First, as shown by portion 301, the reflected power rises slightly when the RF power is turned on and the plasma is struck as in step 205. Next, as shown by the portion 302 the plasma is allowed to stabilize with the reflected value at a relatively low and stable value. Then, when the pressure is reduced in step 215, the reflected power increases momentarily as shown by segment 303. Next, as the RF power is tuned per step 220 of FIG. 2, the reflected power decreases to the relatively low value 304 since the plasma has been ignited and stabilized prior to tuning. Next, when the power is increased per step 225, the reflected power rises as shown by segment 305 to the level shown by 306. This level is higher than the level reached after the RF power is initially turned on as shown by segment 301, because the magnitude of the forward power is greater. However, because start-up transients are not present, the level of reflected power reached at 306 is well within the operating capability of the system and well below the level that would be reached if the forward power were increased to the same level at the beginning of the process. Next, with the power ramped to its final value, the reflected power reaches the level shown by 306. During tuning in step 230 the reflected power rapidly drops as shown by the segment 307 to the level shown by segment 308. The power remains at the level 308 during the entirety of the etch process. It should be noted that the reflected power versus time graph extends a significant distance to the right of FIG. 3, so that the portions from 301–307 occur for only a short percentage of the total time. That is, for the vast majority of the etch time, the pressure is at the reduced value of step 215, and the power is at the increased value of step 225, while the reflected power remains at the low level of 308.

It will be appreciated that many variations on the invented process may be accomplished. For example, as noted earlier, arcing, and difficulty in igniting and stabilizing a plasma, occur under high DC bias voltage conditions. The high DC bias voltage conditions may be due to both low pressure and high power, or may be due to, for example, high power alone. In the case where it is desired to run a plasma process under high power conditions above the system's typical stable operating range, and at a pressure within the system's stable operating range, the process may comprise the steps of: 1) turning on the RF power at low power and the desired final process pressure, 2) stabilizing the plasma without tuning, 3) after a stable plasma is formed, tuning the RF power, 4) increasing the power, and 5) tuning at the increased power. In essence, where the main concern is high power processing, the process as described in FIG. 2, omitting step 215, may be used. Of course, even in the case where the desired operating pressure is not outside the system's stable operating range, the embodiment described in conjunction with FIG. 2, wherein the plasma is struck under higher pressure than the final operating pressure, may be used for even greater stability. Many other alternatives may be accomplished within the scope of the present invention. For example, although the invention was described as being performed through use of programming a recipe, if desired, the method of the present invention, including striking and stabilizing the plasma at low power and then ramping up to a higher power may be hard coded into the system software or hardware.

Thus, an improved method for forming a plasma under high bias conditions has been described. In the present invention, the plasma is started in a regime where it is easy to do so, and thereafter operated in a regime in which it is difficult to obtain stable conditions due to difficulties in establishing a stable plasma. In this way, the operational range may be extended, and/or more stable and consistent conditions can be achieved for consistent processing in, for example, the high power and low pressure region. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of forming a plasma comprising the steps of:

introducing a gas into a chamber at a first pressure;

applying a radio frequency power between two electrodes in said chamber at a first power level to form a plasma;

tuning said radio frequency power at said first power level; and, increasing said radio frequency power to a second power level greater than said first power level.

2. The method as described in claim 1 further comprising the step of tuning said radio frequency power at said second power level.

3. The method as described in claim 1 further comprising reducing the pressure to a second pressure lower than said first pressure prior to said step of tuning said radio frequency power at said first power level.

4. The method as described in claim 2 further comprising reducing the pressure to a second pressure lower than said first pressure prior to said step of tuning said radio frequency power at said first power level.

5. The method as described in claim 1 wherein after said plasma is formed at said first power level, said plasma is stabilized without tuning.

6. The method as described in claim 2 wherein after said plasma is formed at said first power level, said plasma is stabilized without tuning.

7. The method as described in claim 3 wherein after said plasma is formed at said first power level, said plasma is stabilized without tuning.

8. The method as described in claim 1 wherein said second power level is approximately 400 Watts or greater.

9. The method as described in claim 2 wherein said second power level is approximately 400 Watts or greater.

10. The method as described in claim 3 wherein said second power level is approximately 400 Watts or greater and said second pressure is approximately 100 mTorr or less.

11. The method as described in claim 1 wherein said gas comprises Freon 23 and Freon 134a.

12. The method as described in claim 8 wherein said gas comprises Freon 23 and Freon 134a.

13. The method as described in claim 10 wherein said gas comprises Freon 23 and Freon 134a.

14. The method as described in claim 11 wherein said gas further comprises Freon 116 for at least up to and including said step of tuning said radio frequency power at said first power level.

15. The method as described in claim 12 wherein said gas further comprises Freon 116 for at least up to and including said step of tuning said radio frequency power at said first power level.

16. The method as described in claim 13 wherein said gas further comprises Freon 116 for at least up to and including said step of tuning said radio frequency power at said first power level.

17. A method of forming a plasma comprising the steps of:

introducing a gas into a chamber at a first pressure;

applying a radio frequency power between two electrodes in said chamber at a first power level to form a plasma;

stabilizing said plasma without tuning;

reducing the pressure to a second pressure lower than said first pressure;

tuning said radio frequency power at said first power level and said second pressure;

increasing said radio frequency power to a second power level greater than said first power level; and, tuning said radio frequency power at said second power level.

18. The method as described in claim 17 wherein said first power level is approximately 400 Watts or less and said second power level is approximately 400 Watts or greater.

19. The method as described in claim 17 wherein said first pressure is approximately 100 mTorr or greater and said second pressure is approximately 100 mTorr or less.

20. The method as described in claim 18 wherein said first pressure is approximately 100 mTorr or greater and said second pressure is approximately 100 mTorr or less.

21. The method as described in claim 17 wherein said gas comprises Freon 23 and Freon 134a.

22. The method as described in claim 18 wherein said gas comprises Freon 23 and Freon 134a.

23. The method as described in claim 19 wherein said gas comprises Freon 23 and Freon 134a.

24. The method as described in claim 20 wherein said gas comprises Freon 23 and Freon 134a.

25. The method as described in claim 21 wherein said gas further comprises Freon 116 for at least up to and including said step of tuning said radio frequency at said first power level.

26. The method as described in claim 22 wherein said gas further comprises Freon 116 for at least up to and including said step of tuning said radio frequency at said first power level.

27. The method as described in claim 23 wherein said gas further comprises Freon 116 for at least up to and including said step of tuning said radio frequency at said first power level.

28. The method as described in claim 24 wherein said gas further comprises Freon 116 for at least up to and including said step of tuning said radio frequency at said first power level.

29. The method as described in claim 21 wherein said plasma is used for performing an etch of an oxide layer.

30. The method as described in claim 22 wherein said plasma is used for performing an etch of an oxide layer.

31. The method as described in claim 23 wherein said plasma is used for performing an etch of an oxide layer.

32. The method as described in claim 24 wherein said plasma is used for performing an etch of an oxide layer.

33. The method as described in claim 25 wherein said plasma is used for performing an etch of an oxide layer.

34. The method as described in claim 26 wherein said plasma is used for performing an etch of an oxide layer.

35. The method as described in claim 27 wherein said plasma is used for performing an etch of an oxide layer.

36. The method as described in claim 28 wherein said plasma is used for performing an etch of an oxide layer.

* * * * *